(12) United States Patent
Wan et al.

(10) Patent No.: US 11,985,807 B2
(45) Date of Patent: May 14, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Qiang Wan, Hefei (CN); Sen Li, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 428 days.

(21) Appl. No.: 17/399,110

(22) Filed: Aug. 11, 2021

(65) Prior Publication Data

US 2022/0085030 A1  Mar. 17, 2022

Related U.S. Application Data

(63) Continuation of application No. PCT/CN2021/099006, filed on Jun. 8, 2021.

(30) Foreign Application Priority Data

Sep. 17, 2020 (CN) .......................... 202010981038.7

(51) Int. Cl.
*H10B 12/00* (2023.01)
*H01L 21/311* (2006.01)
*H01L 49/02* (2006.01)

(52) U.S. Cl.
CPC ...... *H10B 12/038* (2023.02); *H01L 21/31144* (2013.01); *H01L 28/60* (2013.01); *H10B 12/37* (2023.02)

(58) Field of Classification Search
CPC ............... H01L 21/0332; H01L 21/027; H01L 21/3086; H01L 21/0337; H01L 21/31144;
(Continued)

(56) References Cited

U.S. PATENT DOCUMENTS

2009/0176376 A1   7/2009  Yi
2011/0312183 A1  12/2011  Yi
(Continued)

FOREIGN PATENT DOCUMENTS

CN    100446216 C    12/2008
CN    107393909 A    11/2017
(Continued)

OTHER PUBLICATIONS

Supplementary European Search Report in the European application No. 21785737.4, dated Sep. 16, 2022, 12 pgs.
(Continued)

*Primary Examiner* — Jose R Diaz
(74) *Attorney, Agent, or Firm* — Cooper Legal Group, LLC

(57) ABSTRACT

A method for manufacturing a semiconductor structure includes: a first mask layer is formed on a dielectric layer, in which a first etching hole extending along a first direction parallel to the dielectric layer is formed in the first mask layer; a side of the first mask layer away from the dielectric layer is planarized; a second mask layer is formed on the first mask layer, in which a second etching hole extending along a second direction parallel to the dielectric layer is formed in the second mask layer, the first etching hole and the second etching hole constitute an etching hole; and the dielectric layer is etched along the etching hole to form the capacitor hole.

20 Claims, 32 Drawing Sheets

(58) Field of Classification Search
CPC . H01L 28/90–92; H10B 12/033; H10B 12/00; H10B 12/31; H10B 12/09; H10B 12/37; H10B 12/038
See application file for complete search history.

(56) References Cited

U.S. PATENT DOCUMENTS

2018/0342519 A1* 11/2018 Kim .................. H10B 12/0335
2019/0318929 A1* 10/2019 Chuang .............. H01L 21/0338

FOREIGN PATENT DOCUMENTS

| CN | 108538835 A | 9/2018 |
|----|-------------|--------|
| CN | 109994379 A | 7/2019 |
| CN | 110634733 A | 12/2019 |
| CN | 110707044 A | 1/2020 |
| CN | 210272255 U | 4/2020 |
| KR | 20040059826 A | 7/2004 |
| WO | 2014148423 A1 | 9/2014 |

OTHER PUBLICATIONS

International Search Report in the international application No. PCT/CN2021/099006, dated Sep. 10, 2021, 2 pgs.

\* cited by examiner

"METHOD FOR MANUFACTURING SEMICONDUCTOR STRUCTURE AND SEMICONDUCTOR STRUCTURE"

CROSS-REFERENCE TO RELATED APPLICATIONS

The present application is a continuation application of International Patent Application No. PCT/CN2021/099006, filed on Jun. 8, 2021 and entitled "METHOD FOR MANUFACTURING SEMICONDUCTOR STRUCTURE AND SEMICONDUCTOR STRUCTURE", which claims priority to Chinese Patent Application No. 202010981038.7, filed to the China National Intellectual Property Administration on Sep. 17, 2020 and entitled "METHOD FOR MANUFACTURING SEMICONDUCTOR STRUCTURE AND SEMICONDUCTOR STRUCTURE". The contents of International Patent Application No. PCT/CN2021/099006 and Chinese Patent Application No. 202010981038.7 are hereby incorporated by reference in their entireties.

TECHNICAL FIELD

The present application relates to the technical field of semiconductor manufacturing, and in particular to a method for manufacturing a semiconductor structure and a semiconductor structure.

BACKGROUND

With the gradual development of a storage device technology, a Dynamic Random Access Memory (DRAM) with higher density and faster read-write speed is gradually applied to various electronic devices. The dynamic random access memory is composed of a plurality of repeated memory cells. Each memory cell includes a capacitor and a transistor. A gate of the transistor is connected with a word line, a drain of the transistor is connected with a bit line, and a source of the transistor is connected with the capacitor. A voltage signal on the word line can control the transistor to be turned on and off. Further, data information stored in the capacitor is read through the bit line, or the data information is written, through the bit line, into the capacitor for storage.

With the continuous evolution of a manufacturing process, the integration level of the DRAM is continuously improved, and the transverse dimension of an element is continuously reduced, so that the capacitor has higher aspect ratio, a manufacturing process is increasingly difficult, and phenomena of interconnection of capacitor tubes, insufficient etching, size difference of the capacitor tubes and depth difference of capacitor holes are liable to occur in capacitor tube etching.

SUMMARY

In view of this, an embodiment of the present application provides a method for manufacturing a semiconductor structure and a semiconductor structure.

The embodiment of the present application provides a method for manufacturing a semiconductor structure, including: a substrate layer is provided and a stack is formed on the substrate layer, the stack including a sacrificial layer and a supporting layer arranged one after the other; a first mask layer is formed on the stack, a first etching pattern being formed in the first mask layer; a side of the first mask layer away from the stack is planarized; a second mask layer is formed, a second etching pattern being formed in the second mask layer, the first etching pattern and the second etching pattern constituting an etching hole; and the stack is etched along the etching hole to form a capacitor hole.

The embodiment of the present application further provides a semiconductor structure, which is formed by a method, including: a substrate layer is provided and a stack is formed on the substrate layer, the stack including a sacrificial layer and a supporting layer arranged one after the other; a first mask layer is formed on the stack, a first etching pattern being formed in the first mask layer; a side of the first mask layer away from the stack is planarized; a second mask layer is formed, a second etching pattern being formed in the second mask layer, the first etching pattern and the second etching pattern constituting an etching hole; and the stack is etched along the etching hole to form a capacitor hole.

BRIEF DESCRIPTION OF THE DRAWINGS

In order to describe the technical solutions in the embodiment of the present application or in the conventional art more clearly, a simple introduction on the accompanying drawings which are needed in the description of the embodiment or conventional art is given below. Apparently, the accompanying drawings in the description below are some embodiments of the disclosure. Other drawings may be obtained by those of ordinary skill in the art without any creative effort according to the drawings.

Figure 1:
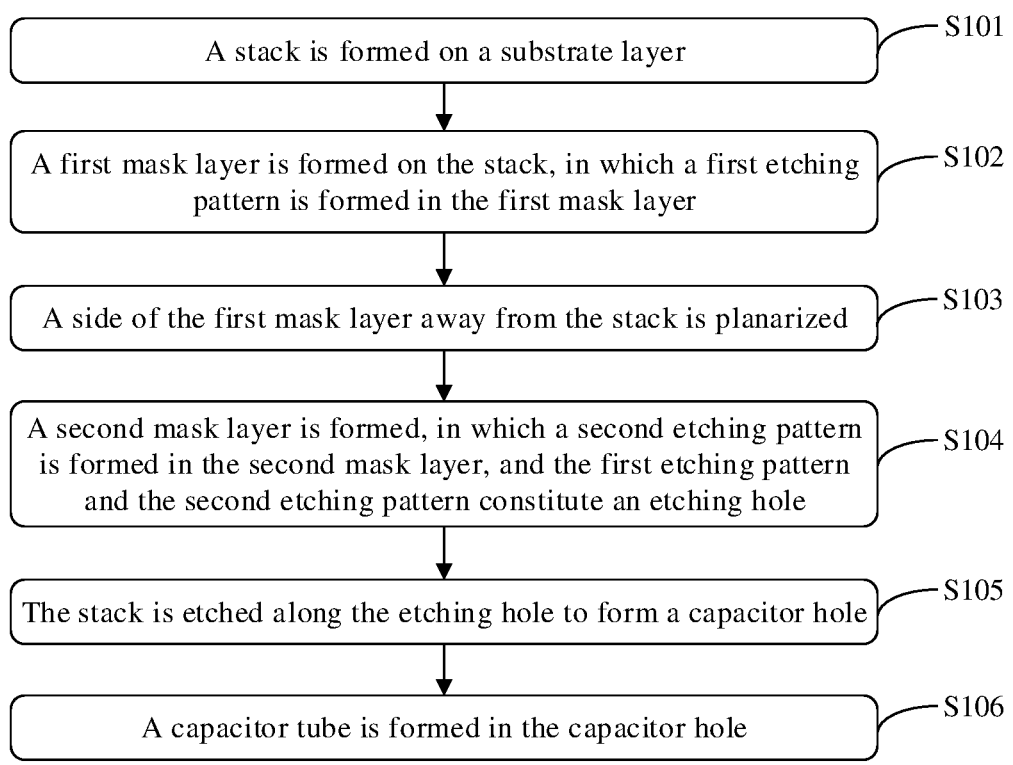
FIG. 1 is a flow chart of a method for manufacturing a semiconductor structure in an embodiment of the present application.

Reference numerals are illustrated as follows.

10—stack; 11—substrate layer; 12—first supporting layer; 13—first sacrificial layer; 14—second supporting layer; 15—second sacrificial layer; 16—third supporting layer; 21—first polysilicon layer; 22—silicon dioxide layer; 23—second polysilicon layer; 30—first mask layer; 31—first base layer; 32—first filling layer; 33—first etching buffer layer; 34—first intermediate hole; 35—first etching hole; 41—first separation layer; 42—first filling material; 50—second mask layer; 51—second base layer; 52—second filling layer; 53—second etching buffer layer; 54—second intermediate hole; 55—second etching hole; 61—second separation layer; 62—second filling material; 71—first photo resist layer; 72—second photo resist layer; 80—preset mask plate; 90—capacitor hole; and 91—etching hole.

DETAILED DESCRIPTION

In order to make objectives, technical solutions, and advantages of the present disclosure more clear, the technical solutions in the embodiment of the present application will be clearly and completely described below in combination with the accompanying drawings in the embodiment of the present application. Apparently, the described embodiments are part of the embodiments of the present application and not all the embodiments. Based on the embodiment in the present application, all other embodiments obtained by those skilled in the art without any creative effort fall within the protection scope of the present application.

A memory may store a data set temporarily or permanently. A Dynamic Random Access Memory (DRAM) typically includes a plurality of capacitor tubes. A charge is stored through the capacitor tubes to register information. The DRAM is a temporary data storage medium and may be used as a memory.

In the related art, the dynamic random access memory is composed of a plurality of repeated memory cells. Each memory cell includes a capacitor and a transistor. A gate of the transistor is connected with a word line, a drain of the transistor is connected with a bit line, and a source of the transistor is connected with the capacitor. A voltage signal on the word line can control the transistor to be turned on and off. Further, data information stored in the capacitor is read through the bit line, or the data information is written, through the bit line, into the capacitor for storage.

With the continuous evolution of a manufacturing process, the integration level of the DRAM is continuously improved, and the transverse dimension of an element is continuously reduced, so that the capacitor has higher aspect ratio, a manufacturing process is increasingly difficult, and phenomena of interconnection of capacitor tubes, insufficient etching, size difference of the capacitor tubes and depth difference of capacitor holes are liable to occur in capacitor tube etching.

The embodiment of the present application provides a method for manufacturing a semiconductor structure. A first mask layer with a first etching hole is formed on a stack, and a side of the first mask layer away from the stack is planarized, so that impurity residue on the first mask layer is avoided, the bottom of a second etching pattern on a second mask layer is flat, and the depths of capacitor holes manufactured through the first mask layer and the second mask layer are the same.

Referring to FIG. 1, FIG. 1 is a flow chart of a method for manufacturing a semiconductor structure in an embodiment of the present application. FIG. 2 to FIG. 32 are schematic diagrams of the semiconductor structure in a plurality of stages. The method for manufacturing the semiconductor structure will be described below in combination with FIG. 1 to FIG. 32.

The embodiment does not limit the semiconductor structure. The semiconductor structure as the DRAM will be described below for an example, but the embodiment is not limited thereto, and the semiconductor structure in the embodiment may also be other structures.

The whole semiconductor structure includes an array region a, a junction region b, and a peripheral region c. The peripheral region c surrounds the array region a, and the peripheral region c and the array region a are transited through the junction region b.

S101, a stack is formed on a substrate layer.

The stack 10 on the substrate layer 11 includes a sacrificial layer and a supporting layer arranged one after the other. The stack 10 is finally configured to form a capacitor hole 90. There may be a plurality of capacitor holes 90. The plurality of capacitor holes 90 may be arranged in the stack 10 and spaced apart from each other. The plurality of capacitor holes 90 may be simultaneously formed through a patterning process to simplify the operation for manufacturing the capacitor holes 90.

The sacrificial layer and the supporting layer arranged one after the other are formed on the substrate layer 11. In an example, the stack 10 includes a first supporting layer 12, a first sacrificial layer 13, a second supporting layer 14, a second sacrificial layer 15, and a third supporting layer 16 which are arranged one after the other along a direction away from a substrate. In other embodiments, the stack 10 may include other number of sacrificial layers and other number of supporting layers, and the embodiment of the present application does not impose any limitation on this. The material of the substrate layer 11 may include tungsten, the material of the supporting layer may include silicon nitride (SiN), and the material of the sacrificial layer may include silicon dioxide. The first supporting layer 12, the first sacrificial layer 13, the second supporting layer 14, the second sacrificial layer 15 and the third supporting layer 16 may be formed through chemical vapor deposition, and a structure of required capacitor holes 90 is formed in the multiple stacked liner layers. The multiple stacked liner layers include the first supporting layer 12, the first sacrificial layer 13, the second supporting layer 14, the second sacrificial layer 15, and the third supporting layer 16.

After the stack 10 is formed, the method for manufacturing a memory provided by the embodiment further includes the following operations.

S102, a first mask layer is formed on the stack, in which a first etching pattern is formed in the first mask layer.

The first etching pattern may be a first etching hole 35 extending along a first direction parallel to the stack 10. There may be a plurality of first etching holes 35. The first etching pattern is located in the array region a and a part of the junction region b.

The first mask layer 30 may be formed on the stack 10 through a deposition process, for example a chemical vapor deposition process or a physical vapor deposition process.

Figure 3:
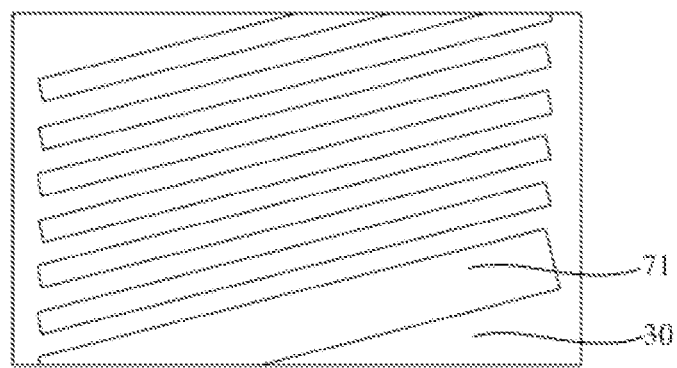
FIG. 3 is a top view of FIG. 2.

The plurality of first etching holes 35 may be arranged parallel to each other and spaced apart from each other. For example, the plurality of first etching holes 35 may be spaced apart from each other by an equal distance. The plurality of first etching holes 35 extend along the first direction parallel to the stack 10. For example, an orientation shown in FIG. 3 is taken as an example, the first direction is a direction inclined with respect to the horizontal direction.

Further, the operation that the first mask layer 30 is formed includes the following operations.

A first base layer 31 and a first filling layer 32 are sequentially formed on the stack 10, and a part of the first filling layer 32 is removed to form a first intermediate hole 34 extending along the first direction.

The material of the first base layer 31 may include an oxide, such as silicon dioxide. The material of the first filling layer 32 may include a spin-on hard mask (SOH), such as a spin-on carbon hard mask (SOC). In some embodiments, a first etching buffer layer 33 is also arranged on the first filling layer 32, and the material of the first etching buffer layer 33 includes silicon dioxide, silicon oxynitride, and silicon nitride. That is, the first base layer 31, the first filling layer 32, and the first etching buffer layer 33 are sequentially formed on the stack 10 from bottom to top to form the structure shown in FIG. 2.

Figure 2:
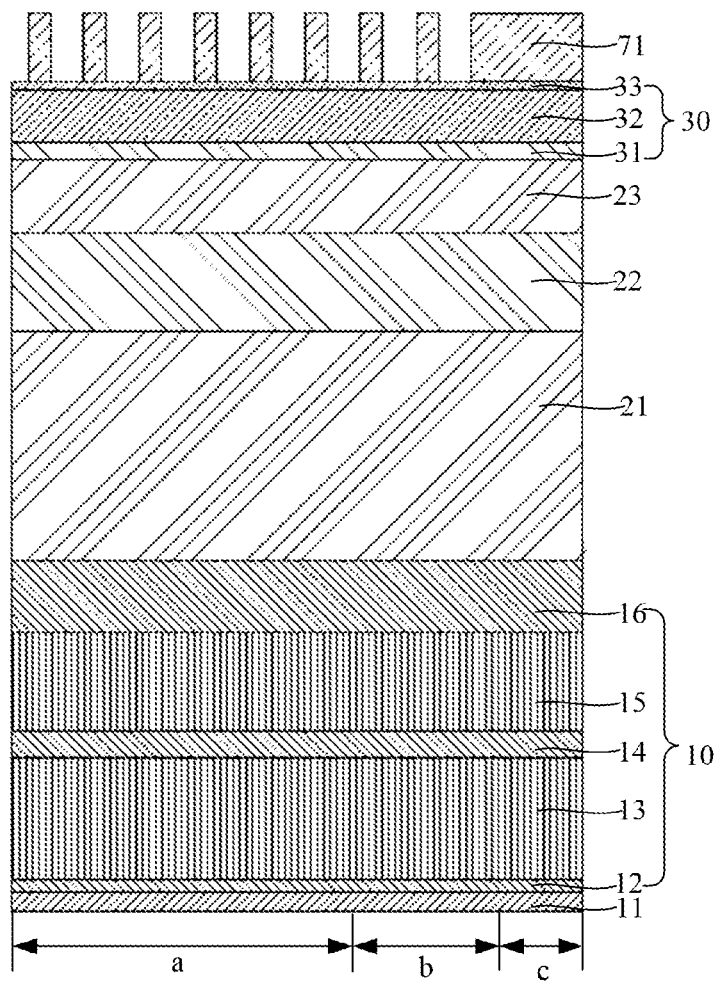
FIG. 2 is a cross-sectional view of a semiconductor structure in an embodiment of the present application, in which a pattern of a first photo resist layer is formed.

The first intermediate hole 34 may be formed by a patterning processing technique. In an example, a first photo resist layer (PR) 71 is coated on the first mask layer. The first photo resist layer 71 is processed through a process such as exposure development and the like to form a pattern as shown in FIG. 2 and FIG. 3. The first etching buffer layer 33 and the first filling layer 32 are etched by taking the first photo resist layer 71 as a mask to form the first intermediate hole 34. A remaining part of the first photo resist layer 71 is removed.

Etching may be performed through dry etching with a high selectivity ratio to form the first intermediate hole 34 penetrating through the first etching buffer layer 33 and the first filling layer 32, so that the etched first intermediate hole 34 has higher precision.

After the first intermediate hole 34 is formed, a first separation layer 41 is formed on a side wall and a bottom of the first intermediate hole 34 and on a surface of the first filling layer 32 away from the first base layer 31. In an embodiment in which the first etching buffer layer 33 is arranged on the first filling layer 32, the first separation layer 41 on the surface of the first filling layer 32 away from the first base layer 31 covers the first etching buffer layer 33.

The material of the first separation layer 41 may be the same as the material of the first base layer 31, for example silicon dioxide. Of course, the material of the first separation layer 41 may also be different from the material of the first base layer 31.

Figure 4:
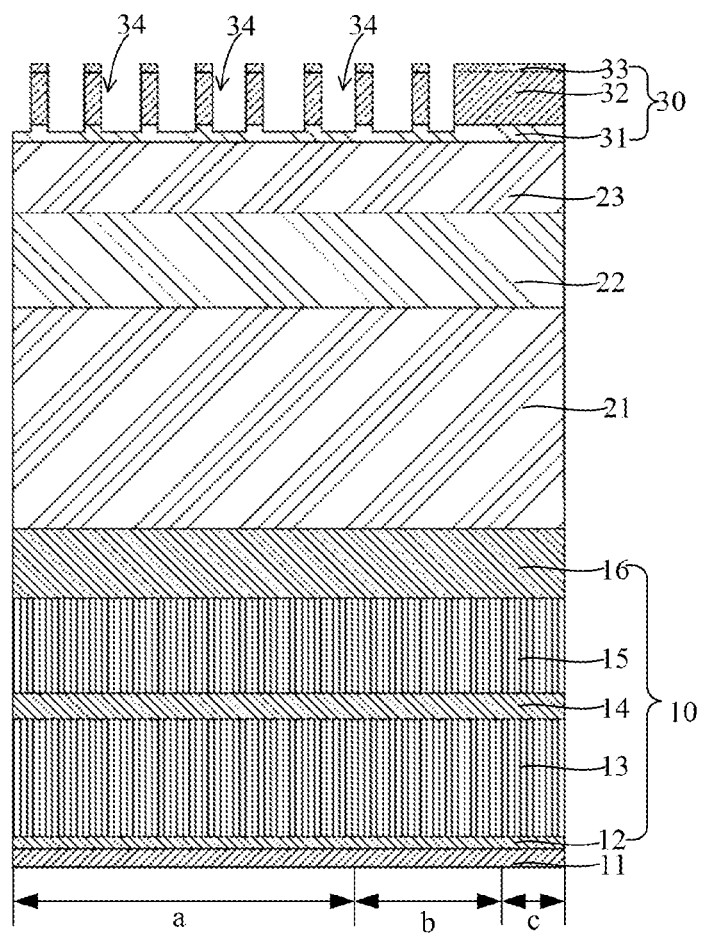
FIG. 4 is a cross-sectional view of a semiconductor structure in an embodiment of the present application, in which a first intermediate hole is formed.
Figure 5:
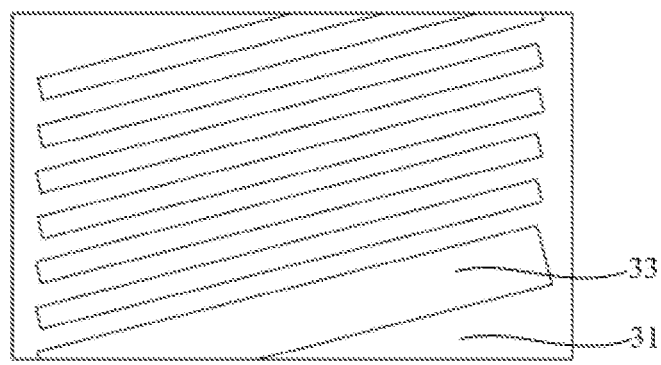
FIG. 5 is a top view of FIG. 4.

When the part of the first filling layer 32 is removed to form the first intermediate hole 34, a part of the first base layer 31 is also removed to form the structure as shown in FIG. 4 and FIG. 5, so that the bottom of the first intermediate hole 34 is located in the first base layer 31. Accordingly, when the first separation layer 41 is formed, the thickness of the first separation layer 41 is equal to the depth of the first intermediate hole 34 in the first base layer 31. Through such an arrangement, the bottoms of the subsequently formed plurality of first etching holes 35 are flush with each other. That is, the depths of the first etching holes 35 are the same. Further, the bottom of each of the first etching holes 35 is flush with the surface, of the first base layer 31 away from the substrate layer 11.

Figure 6:
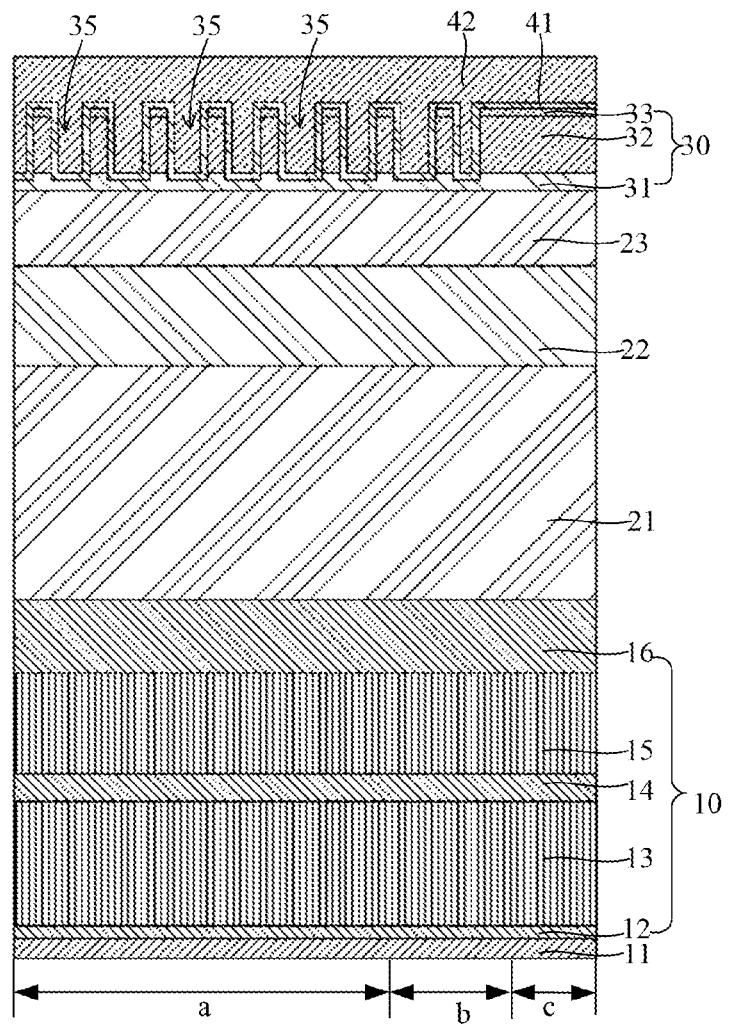
FIG. 6 is a cross-sectional view of a semiconductor structure in an embodiment of the present application, in which a first filling material is formed.
Figure 7:
FIG. 7 is a top view of FIG. 6.

Further, after the first separation layer 41 is formed, a first filling material 42 is formed on the first separation layer 41, as shown in FIG. 6 and FIG. 7. The first separation layer 41 in the first intermediate hole 34 forms the first etching hole 35.

The material of the first filling material 42 may be the same as the material of the first filling layer 32. The first filling material 42 may be carbon (for example, N-PR, SOH, SOC, and the like) which has better fluidity and filling property. The first filling material 42 may be formed through Atomic Layer Deposition (ALD) to improve a film-forming effect. The first filling material 42 is higher than the first separation layer 41, so that the first filling material 42 covers the outside of the first separation layer 41 for protecting the first separation layer 41, and planarization may be effectively and uniformly performed in a subsequent process.

Figure 8:
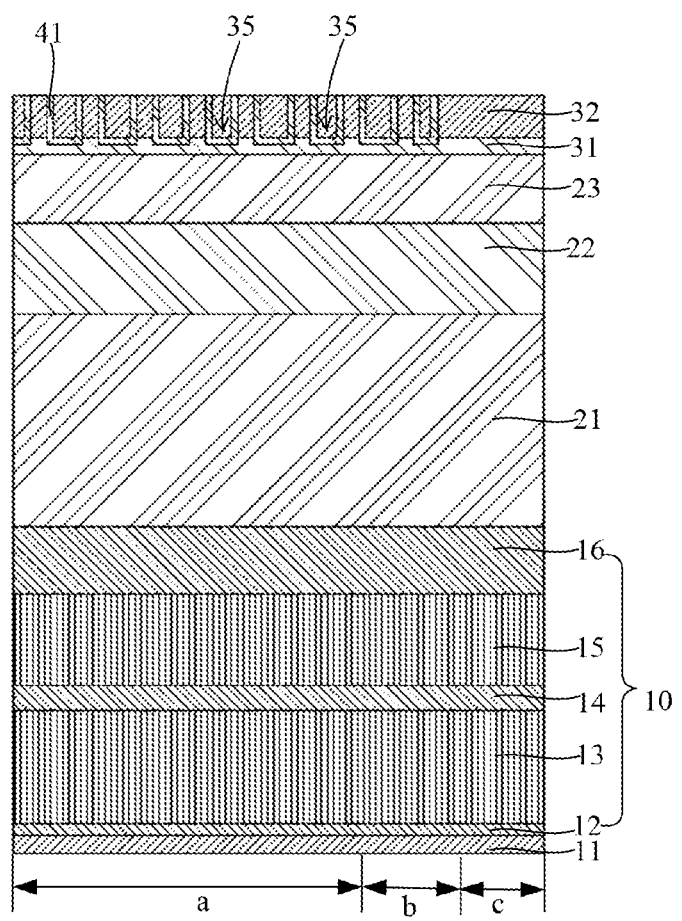
FIG. 8 is a cross-sectional view of a semiconductor structure in an embodiment of the present application, in which a first mask layer is planarized.
Figure 9:
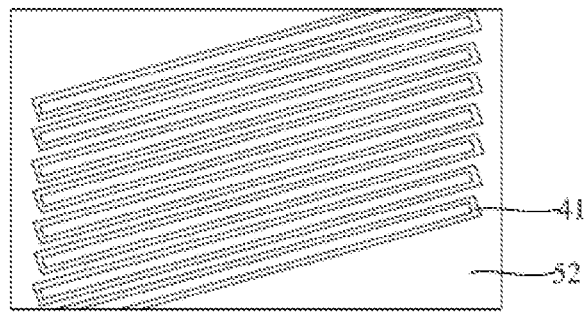
FIG. 9 is a top view of FIG. 8.
Figure 10:
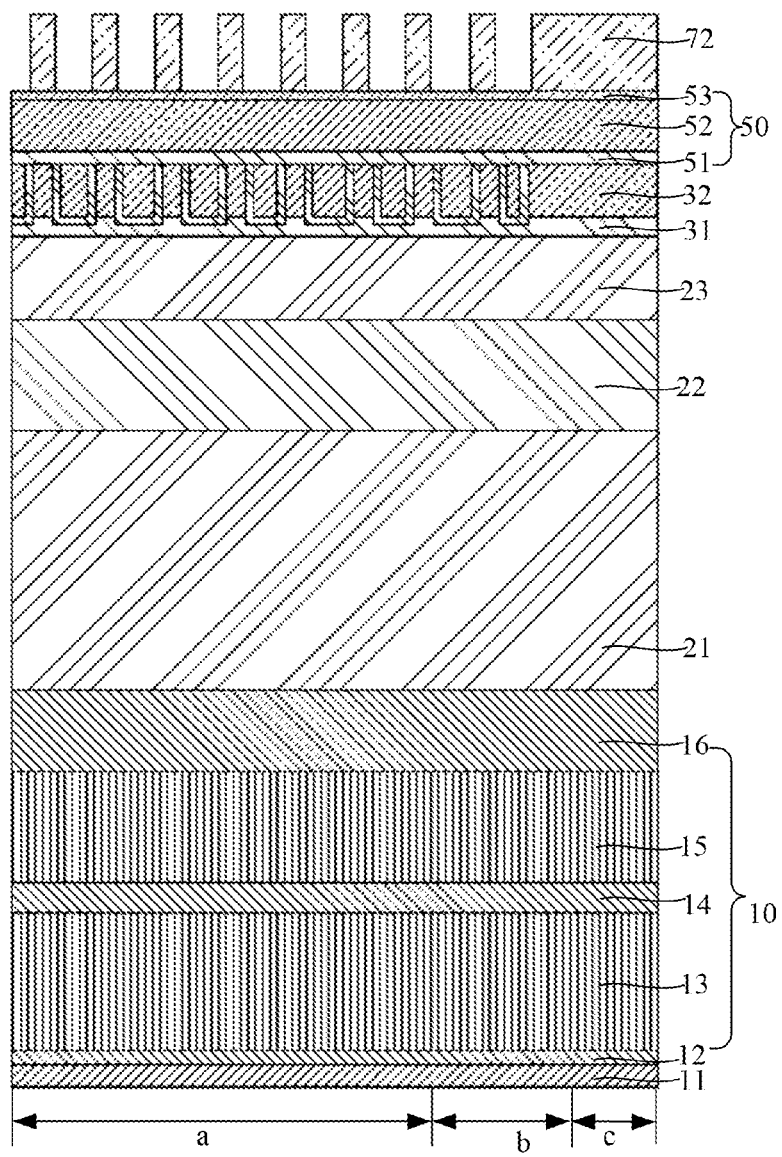
FIG. 10 is a cross-sectional view of a semiconductor structure in an embodiment of the present application, in which a pattern of a second photo resist layer is formed.

Referring to FIG. 8 and FIG. 9, the first separation layer 41 in the first intermediate hole 34 forms the first etching hole 35, and the first etching hole 35 is substantially an elongated slot.

After the first mask layer 30 is formed, the method for manufacturing the semiconductor structure provided by the embodiment further includes the following operation.

S103, a side of the first mask layer away from the stack is planarized.

In an example, after the first filling material 42 is formed, the first mask layer 30 is planarized. Accordingly, a first surface layer of the first filling layer 32, and the first separation layer 41 and the first filling material 42 located outside the first surface layer are removed. The first surface layer is a part of the first filling layer 32 away from the first base layer 31. An orientation shown in FIG. 8 is taken as an example, the first surface layer is located below the first separation layer 41, so that during planarization, a part of the first separation layer 41 located in the first surface layer is also removed to form the structure shown in FIG. 8 and FIG. 9. Through planarization, an impurity located on the surface of the first filling material 42 may be removed, thereby avoiding material accumulation at the impurity in a subsequent process.

In an example, during the planarization process, the first surface layer, and the first separation layer 41 and the first filling material 42 located outside the first surface layer may be removed through a Chemical Mechanical Polishing (CMP) process.

After the side of the first mask layer 30 away from the stack 10 is planarized, the method provided by the embodiment further includes the following operation.

S104, a second mask layer is formed, in which a second etching pattern is formed in the second mask layer, and the first etching pattern and the second etching pattern constitute an etching hole.

Figure 11:
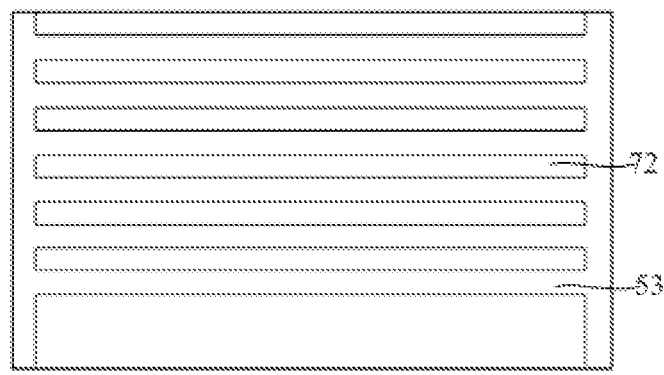
FIG. 11 is a top view of FIG. 10.

In an example, the second etching pattern may be second etching holes 55. The second etching hole 55 extends along a second direction in the second mask layer 50. The orientation shown in FIG. 11 is taken as an example, the second direction may be parallel to the horizontal direction. In an embodiment in which the first direction is inclined with respect to the horizontal direction, a region where projection of the first etching hole 35 on the stack 10 and the projection of the second etching hole 55 on the stack 10 intersect is in the form of a parallelogram, so that the etching hole is in the form of a parallelogram. Of course, the embodiment does not limit the first direction and the second direction, as long as a certain angle is formed between the first direction and the second direction, so that the region where the projection of the first etching hole 35 on the stack 10 and the projection of the second etching hole 55 on the stack 10 intersect is in the form of the parallelogram.

The second etching pattern is located in the array region a and a part of the junction region b.

In the embodiment, after the second mask layer 50 is formed, the following operation is further included.

S105, the stack is etched along the etching hole to form a capacitor hole.

After the capacitor hole 90 is formed, the following operation is further included.

S106, a capacitor tube is formed in the capacitor hole.

In an example, a conductive material may be formed on the wall of the capacitor hole in a manner such as deposition, electroplating and the like, to form the capacitor tube.

According to the method for manufacturing the semiconductor structure provided by the embodiment, the first mask layer 30 is formed on the stack 10. The first etching hole 35 extending along the first direction is formed on the first mask layer 30. After the first mask layer 30 is formed, a side of the first mask layer 30 away from the stack 10 is planarized. The second mask layer 50 is formed on the first mask layer 30. The second etching hole 55 extending in the second direction is provided on the second mask layer 50, and the first etching hole 35 and the second etching hole 55 constitute the etching hole. The capacitor hole 90 is formed on the stack 10 through the etching hole, and the capacitor tube is formed in the capacitor hole 90. Before the second mask layer 50 is formed, the first mask layer 30 is planarized, so that an impurity remaining on the surface of the first mask layer 30 may be removed, material accumulation at a junction of the first mask layer 30 and the second mask layer 50 when the second mask layer 50 is formed is avoided. Therefore, the depths of the second etching holes 55 on the second mask layer 50 are the same, and the depths of the formed capacitor holes 90 are the same.

In addition, since the depths of the second etching holes 55 are the same and etching time is easy to control, so that the sizes of the capacitor holes 90 are the same, the sizes of the formed capacitor tubes are the same, and therefore interconnection of the capacitor tube is avoided.

In the embodiment, the operation that the second mask layer 50 is formed includes the following operation.

Referring to FIG. 10 to FIG. 15, a second base layer 51 and a second filling layer 52 are sequentially formed on the first mask layer 30. A part of the second base layer 51 is removed to form a second intermediate hole 54 extending along the second direction. A second separation layer 61 is formed on a side wall and a bottom of the second intermediate hole 54 and on a surface of the second filling layer 52 away from the second base layer 51. The second separation layer in the second intermediate hole 54 forms the second etching hole 55.

Specifically, a second etching buffer layer 53 is arranged on the second filling layer 52, and the material of the second etching buffer layer 53 includes silicon dioxide, silicon oxynitride, and silicon nitride. A second photo resist layer 72 is coated on the second etching buffer layer 53, and the second photo resist layer 72 forms a pattern shown in FIG. 11. The second etching buffer layer 53 and the second filling layer 52 are etched by taking the second photo resist layer 72 as a mask plate to form the second intermediate hole 54 shown in FIG. 12.

Figure 12:
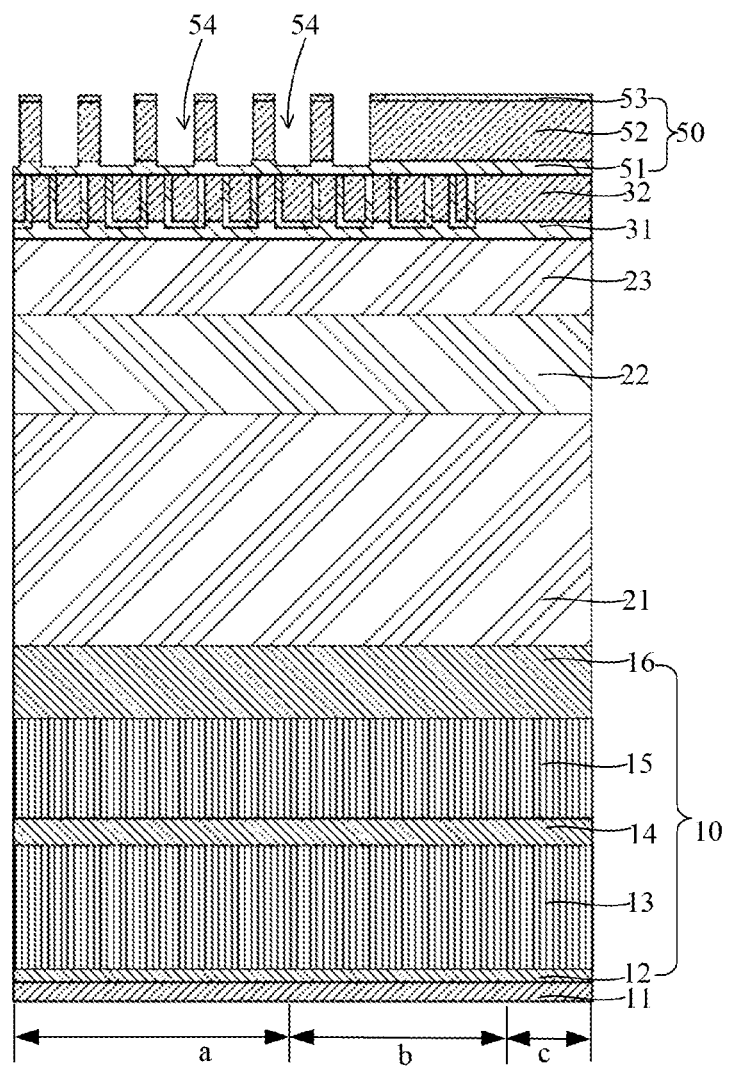
FIG. 12 is a cross-sectional view of a semiconductor structure in an embodiment of the present application, in which a second intermediate hole is formed.
Figure 13:
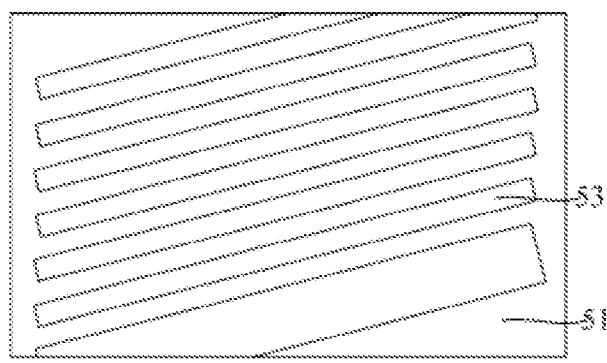
FIG. 13 is a top view of FIG. 12.
Figure 14:
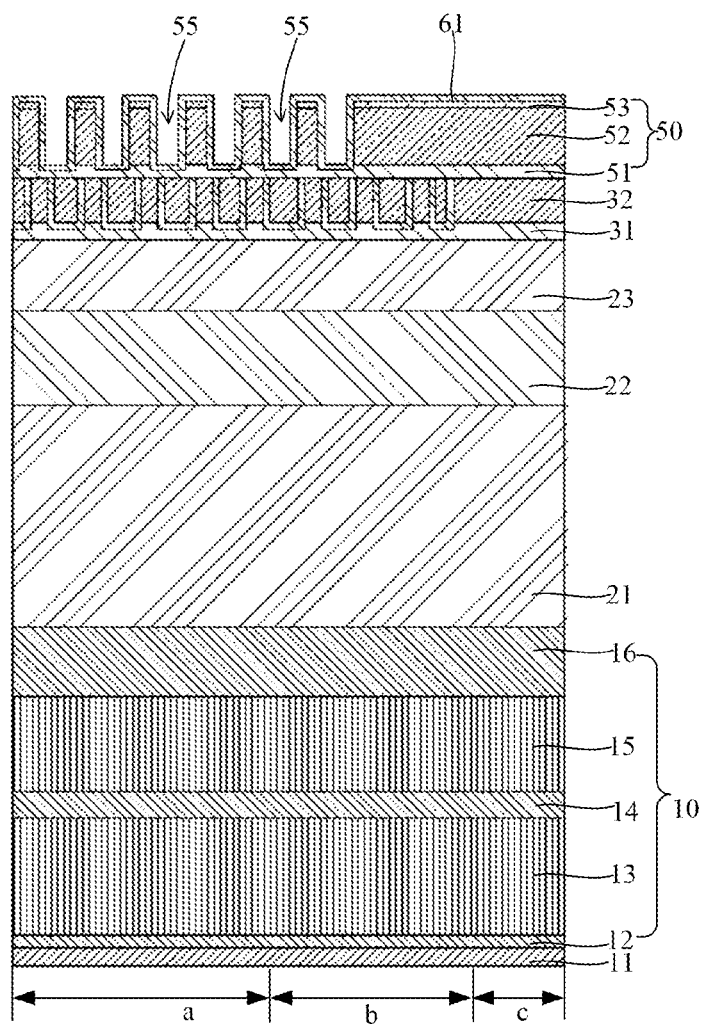
FIG. 14 is a cross-sectional view of a semiconductor structure in an embodiment of the present application, in which a pattern of a second separation layer is formed.
Figure 15:
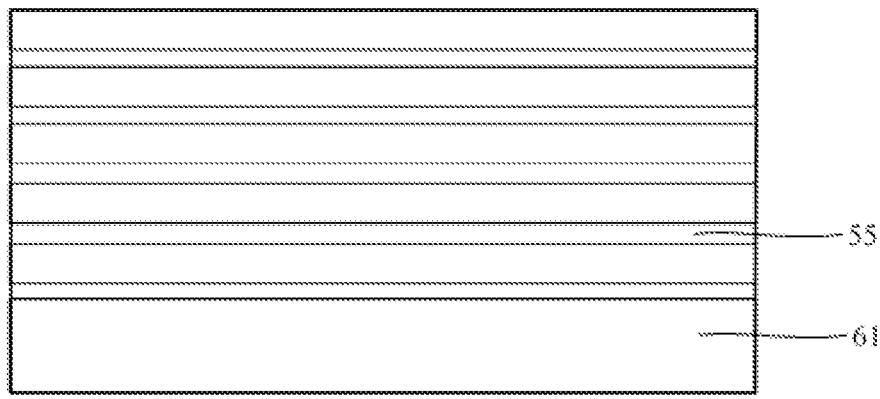
FIG. 15 is a top view of FIG. 14.

Further, when the part of the second filling layer 52 is removed to form the second intermediate hole 54, a part of the second base layer 51 is also removed to form a structure shown in FIG. 12 and FIG. 13, and the bottom of the second intermediate hole 54 is located in the second base layer 51. Accordingly, when the second separation layer 61 is formed, the thickness of the second separation layer 61 is equal to the depth of the second intermediate hole 54 in the second base layer 51, as shown in FIG. 14 and FIG. 15. Through such an arrangement, subsequent leveling of the bottom of the second intermediate hole 54 is facilitated, the bottoms of the subsequently formed plurality of second etching holes 55 are flush with each other. That is, the depths of the second etching holes 55 are the same. Further, the bottoms of the second etching holes 55 are flush with the surface of the second base layer 51 away from the substrate layer 11.

The materials of the second base layer 51, the second filling layer 52, and the second separation layer 61 may refer to the materials of the first base layer 31, the first filling layer 32, and the first separation layer 41 respectively, and will not be described in detail herein.

In the embodiment, after the second separation layer 61 is formed, the following operation is further included.

Figure 16:
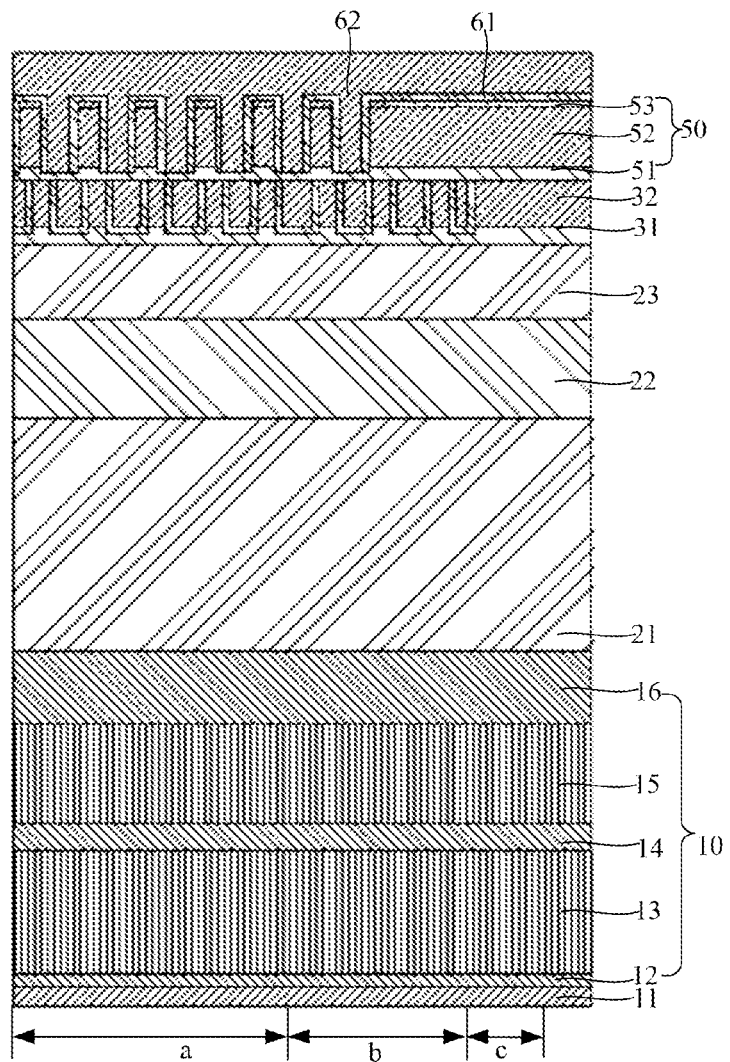
FIG. 16 is a cross-sectional view of a semiconductor structure in an embodiment of the present application, in which a second filling material is formed.
Figure 17:
FIG. 17 is a top view of FIG. 16.

A second filling material 62 is formed on the second separation layer 61 to form the structure shown in FIG. 16 and FIG. 17.

The second filling material 62 may be the same as the first filling material 42, and the second filling material 62 and the first filling material 42 are hard mask plates.

Figure 18:
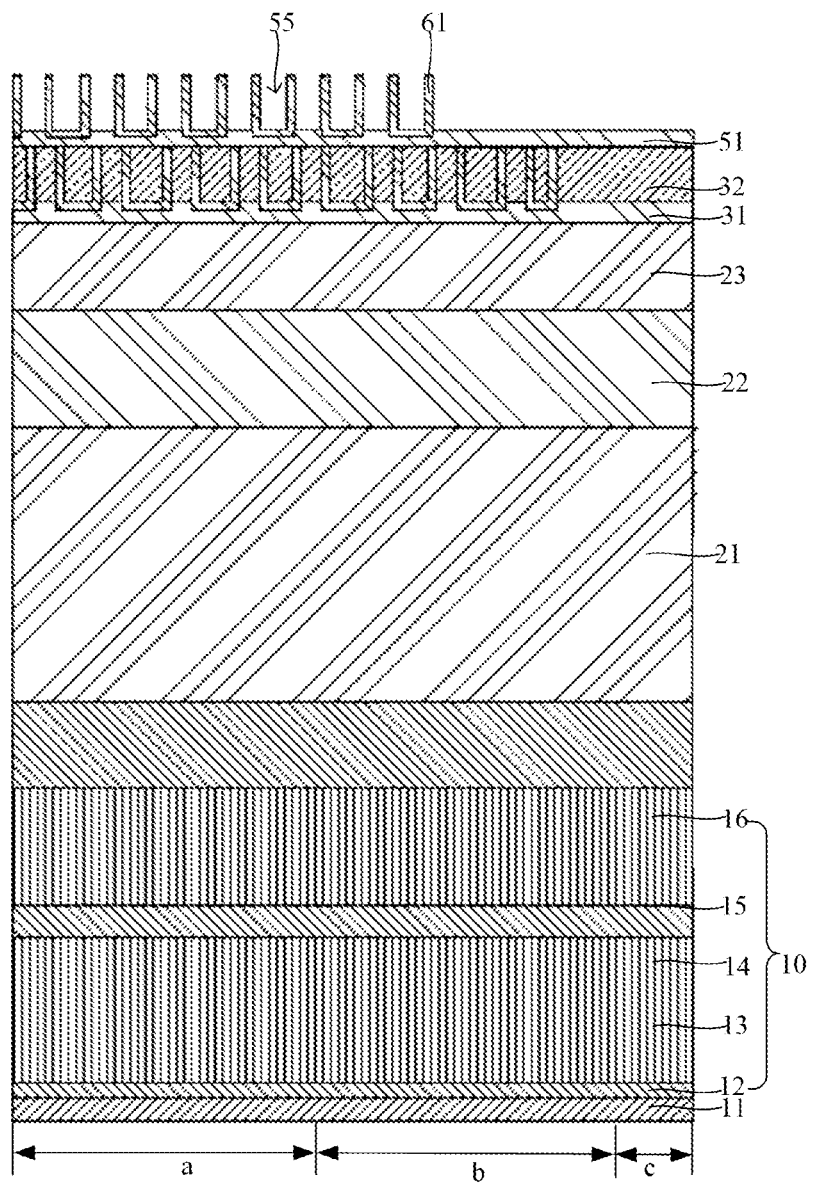
FIG. 18 is a cross-sectional view of a semiconductor structure in an embodiment of the present application, in which a second filling layer is removed.
Figure 19:
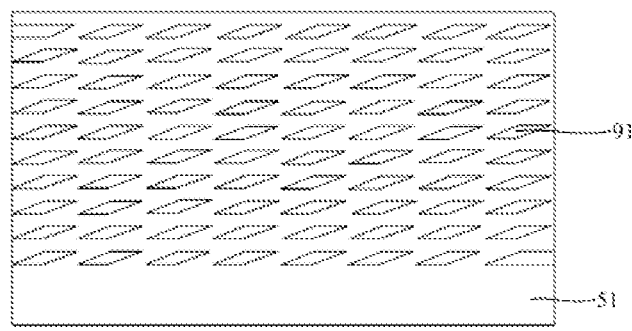
FIG. 19 is a top view of FIG. 18.

After the second surface layer of the second filling layer 52 and the second separation layer 61 and the second filling material 62 located outside the second surface layer are removed, the method further includes that the following operation. The second filling layer 52 and a remaining part of the second filling material 62 are removed, as shown in FIG. 18 and FIG. 19. Through such an arrangement, a preset mask plate 80 may be directly formed on the second base layer 51 to form the structure as shown in FIG. 20 and FIG. 21, thereby further reducing a distance between the preset mask plate 80 and an end of the second etching hole 55 away from the second base layer 51, and further avoiding collapse of the preset mask plate 80 in the junction region.

Figure 20:
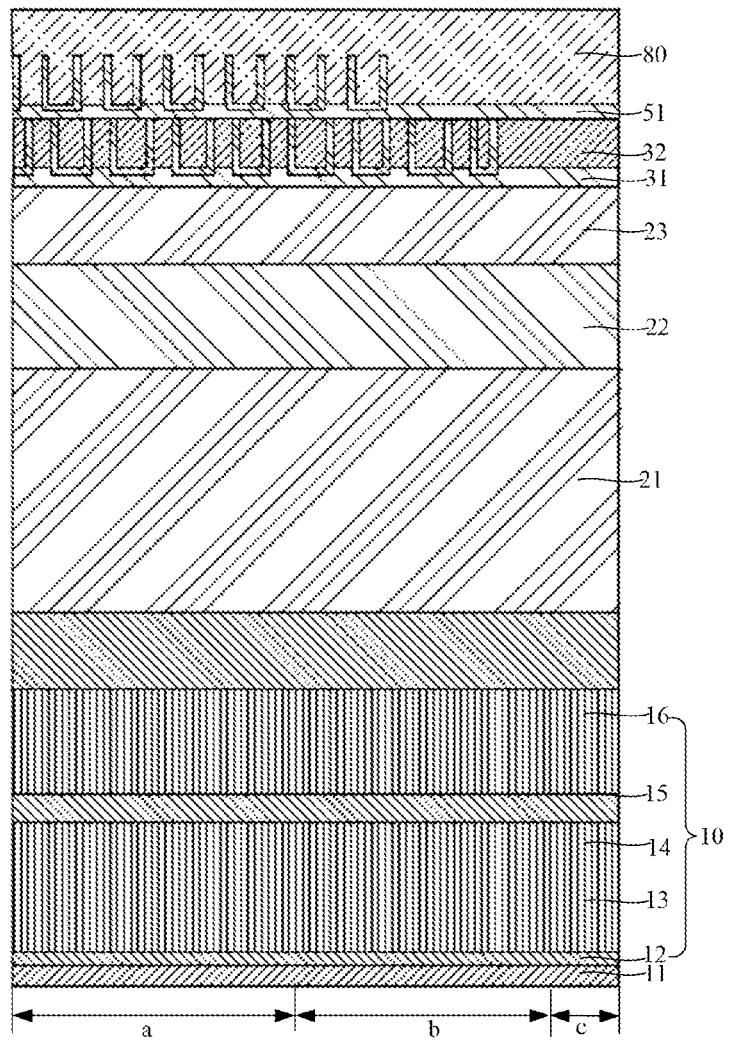
FIG. 20 is a cross-sectional view of a semiconductor structure in an embodiment of the present application, in which a preset mask plate is formed.
Figure 21:
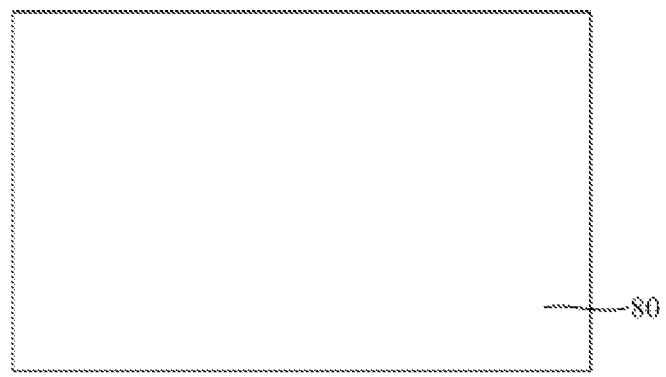
FIG. 21 is a top view of FIG. 20.

As shown in FIG. 20 and FIG. 21, in the embodiment, after the second separation layer 61 is formed, the method further includes the following operation. The preset mask plate 80 is formed on the second mask layer 50. The second mask layer 50 includes an array region a with the second etching hole 55, a peripheral region c in absence of the second etching holes 55, and a junction region b between the array region a and the peripheral region c. A plurality of second etching holes 55 (for example, 10) are formed in the junction region b. The preset mask plate 80 covers the peripheral region c and the junction region b.

Through such an arrangement, during etching of the stack 10 through the first mask layer 30 and the second mask layer 50, the capacitor hole 90 is formed on the stack 10 corresponding to the array region a, and the stack 10 corresponding to the peripheral region c and the junction region b is reserved.

Further, before the preset mask plate 80 is formed, the method further includes the following operation. The second surface layer of the second filling layer 52, and the second separation layer 61 and the second filling material 62 located outside the second surface layer are removed.

The second surface layer is a part of the second filling layer 52 away from the stack 10. The second separation layer 61 in the second surface layer is also removed while the second surface layer is removed, so that the surface of the second mask layer 50 is flat. Since the second surface layer and the second separation layer 61 and the second filling material 62 located outside the second surface layer are removed, the distance between the formed preset mask plate 80 and an end of the second etching hole 55 away from the second base layer 51 may also be reduced (that is, the height of the preset mask plate 80 is reduced). Therefore, sideslip of the preset mask plate 80 in the junction region b is avoided, and the second etching hole 55 in the array region a is prevented from being blocked by the side slipping preset mask plate 80. Therefore, the situation that a film layer corresponding to the blocked second etching hole 55 does not open in a subsequent manufacturing process, and the occurrence of peeling defect may be avoided. In addition, the wall of the second etching hole 55 may also be perpendicular to the surface of the second separation layer 61 located outside the second etching hole 55, thereby avoiding the sideslip of the preset mask plate 80 in the junction region b.

In the embodiment, the material of the preset mask plate 80 may be photo resist. After the photo resist layer is coated on the second mask layer, the photo resist layer is processed through a process such as exposure development and the like to form the preset mask plate 80 shown in FIG. 22 and FIG. 23.

In the above embodiment, before the first mask layer 30 is formed, the method includes the following operation. A first polysilicon layer 21, a silicon dioxide layer 22, and a second polysilicon layer 23 are sequentially formed on the stack 10.

The first polysilicon layer 21, the silicon dioxide layer 22, and the second polysilicon layer 23 are sequentially stacked on the stack 10. Boron and/or phosphorous may be doped in the silicon dioxide layer 22. For example, the material of the silicon dioxide layer 22 may be Phosphorus Silicon Glass (PSG) or Boron Phosphorus Silicon Glass (BPSG). In the embodiment of the present application, the material of the silicon dioxide layer 22 is the BPSG, and the doping concentration of the boron and the phosphorus in the BPSG is gradually changed along the direction away from the first polysilicon layer 21. Specifically, the doping concentration of boron and phosphorus in the BPSG may be gradually increased or decreased along the direction away from the first polysilicon layer 21.

The BPSG is BP Silicon Glass. The boron and phosphorus are doped in $SiO_2$ to reduce the re-flow temperature of $SiO_2$. $SiO_2$ film becomes denser and flatter after re-flow, so that the silicon dioxide film has better step coverage capability. In an example, the silicon dioxide layer 22 in which the boron and phosphorus are doped through gradual BPSG (GRD BPSG) may be adopted, and the concentration of the boron and the phosphorus may be increased linearly or decreased linearly with an increase of the height of the silicon dioxide layer 22.

Figure 22:
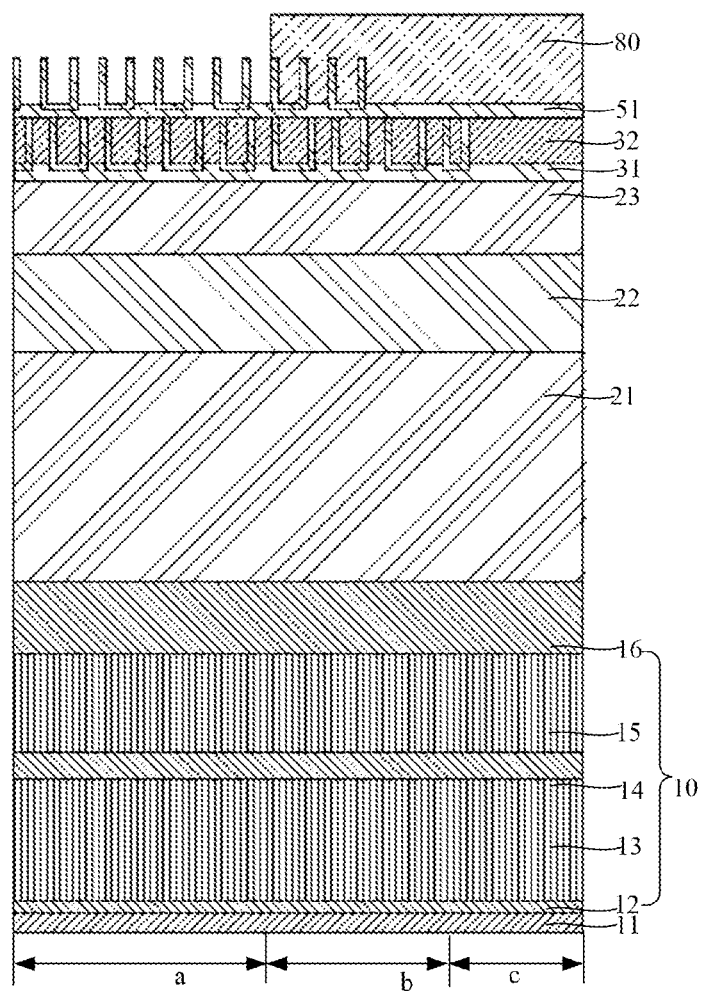
FIG. 22 is a cross-sectional view of a semiconductor structure in an embodiment of the present application, in which a pattern of a preset mask plate is formed.
Figure 23:
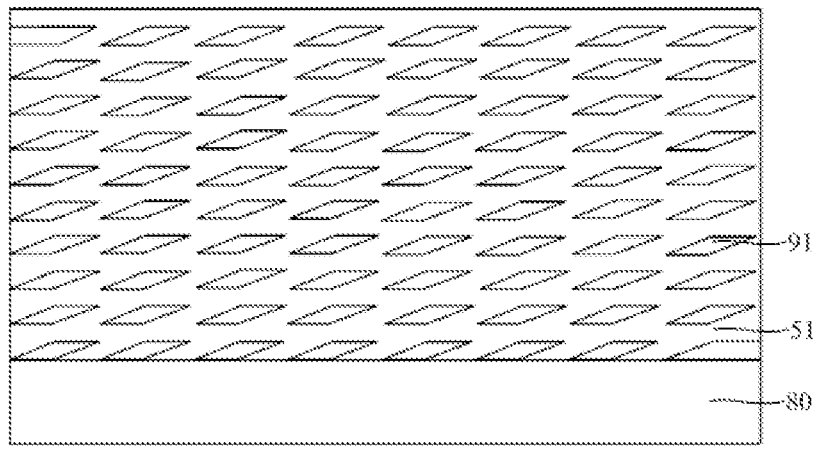
FIG. 23 is a top view of FIG. 22.
Figure 24:
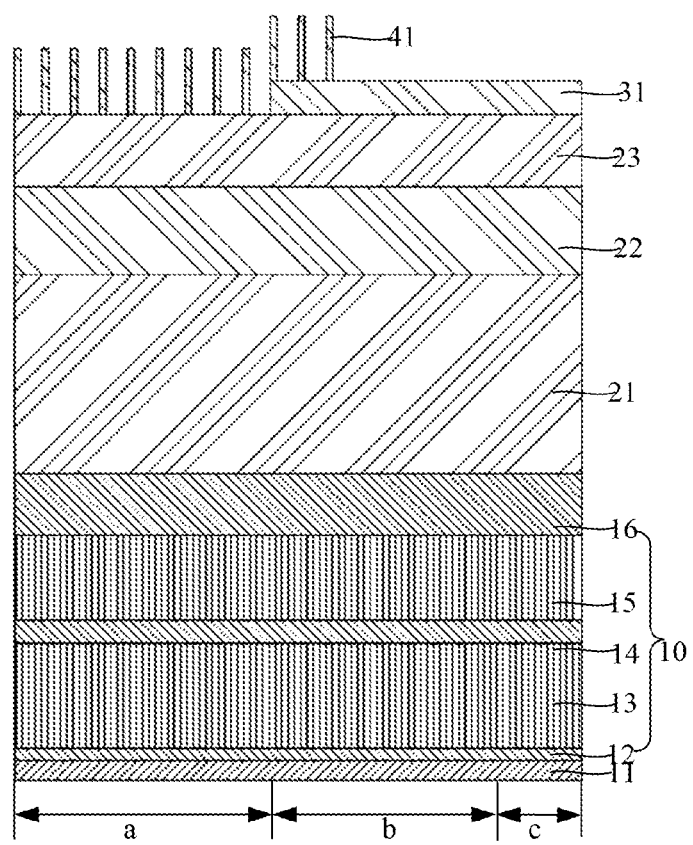
FIG. 24 is a cross-sectional view of a semiconductor structure in an embodiment of the present application, in which a part of a first basic layer is etched away.
Figure 25:
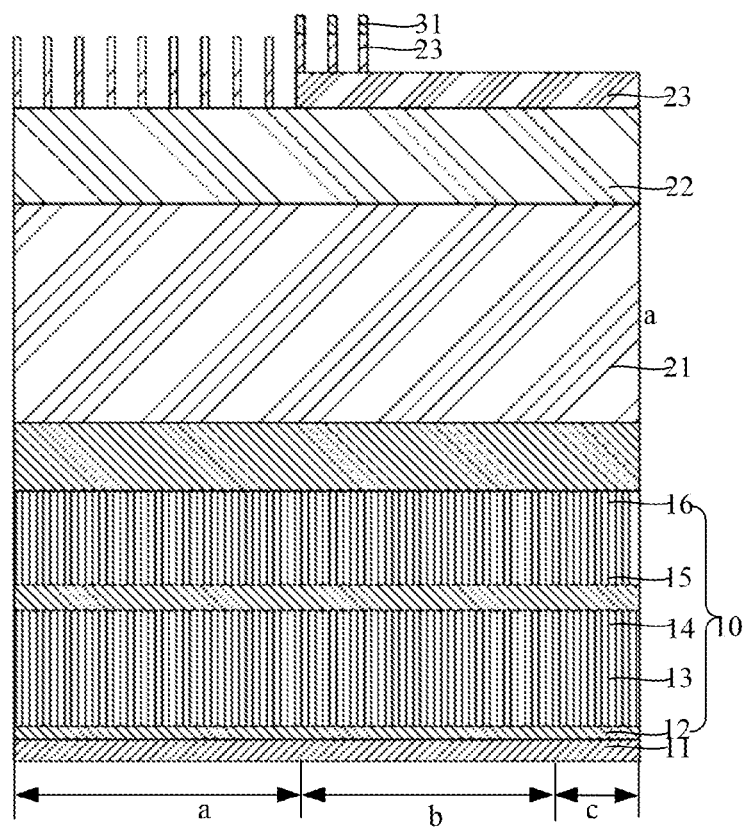
FIG. 25 is a cross-sectional view of a semiconductor structure in an embodiment of the present application, in which a part of a second polysilicon layer is etched way.
Figure 26:
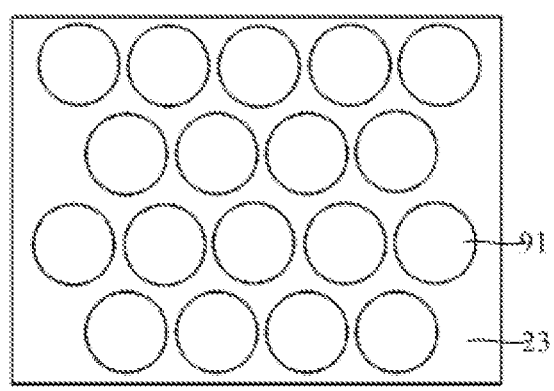
FIG. 26 is a top view of FIG. 25.
Figure 27:
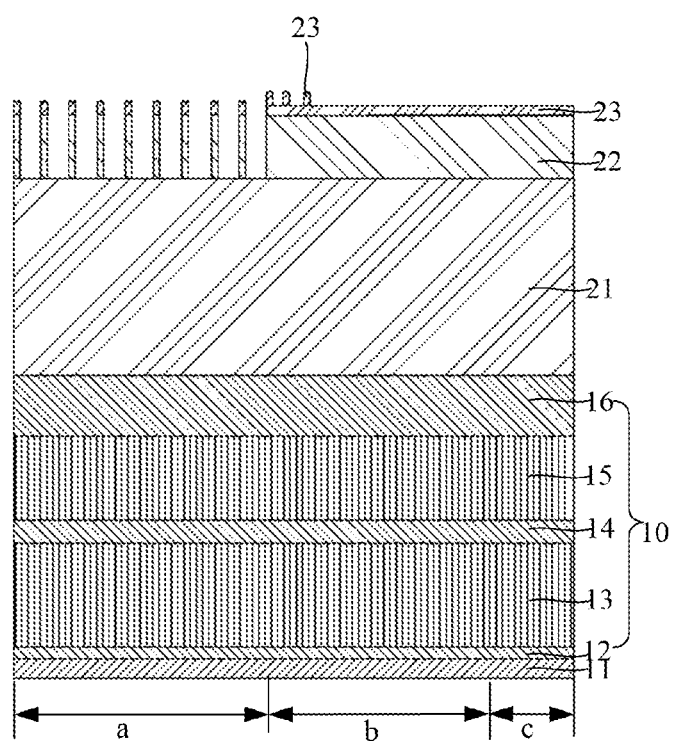
FIG. 27 is a cross-sectional view of a semiconductor structure in an embodiment of the present application, in which a part of a silicon dioxide layer is etched away.

In an example, in the silicon dioxide layer 22 shown in FIG. 22, the doping concentration of the boron and the phosphorus increase linearly from top to bottom. That is, the concentration of the boron and the phosphorus in an upper part in the silicon dioxide layer 22 is greater than that in a lower part in the silicon dioxide layer 22. The etching rate is controlled by controlling the content ratio of the boron and the phosphorus, so that an etching procedure is controlled and a required structure is formed.

The first polysilicon layer 21 and the second polysilicon layer 23 have higher selectivity, so that etching material may be saved, and etching precision is improved. In addition, since the selectivity ratio of polysilicon silicon to oxide is higher, etching is easier compared with an Amorphous Carbon Layer (ACL), and the height of the mask may be reduced through adoption of the polysilicon silicon layer. The second polysilicon layer 23 is arranged on a side of the first mask layer 30 close to the stack 10, so that the second polysilicon layer 23 may be directly removed in the subsequent process, a separate process is not needed to remove the second polysilicon layer 23, and the difficulty for manufacturing the memory is simplified. In addition, compared with the ACL, the height of the mask plate in the mask etching may be effectively reduced, and the etching material is effectively reduced. Due to the high selectivity ratio of the polysilicon layer to the oxide, a process widow is increased, and under etch is highlighted in advance.

In the embodiment, after the preset mask plate 80 is formed, the stack 10 is etched along the etching hole 91 to form the capacitor hole 90.

Figure 28:
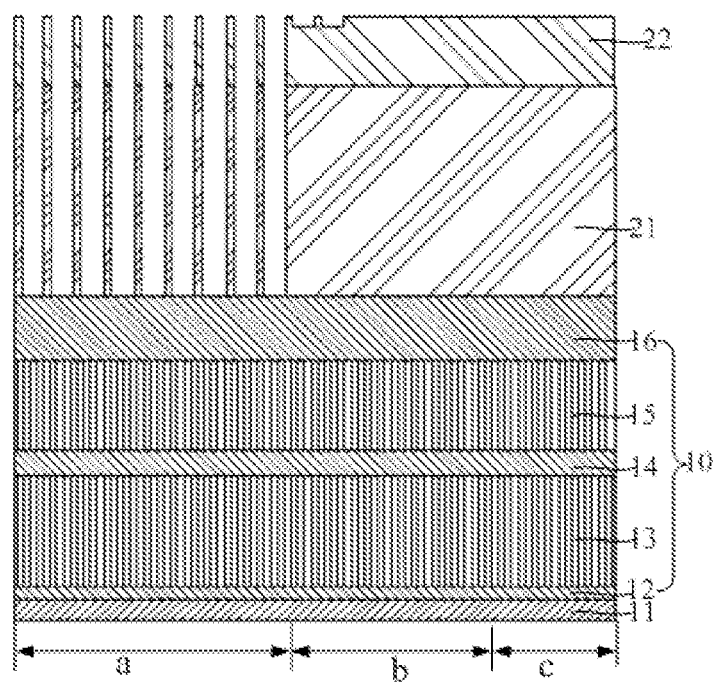
FIG. 28 is a cross-sectional view of a semiconductor structure in an embodiment of the present application, in which a part of a silicon dioxide layer is etched away.
Figure 29:
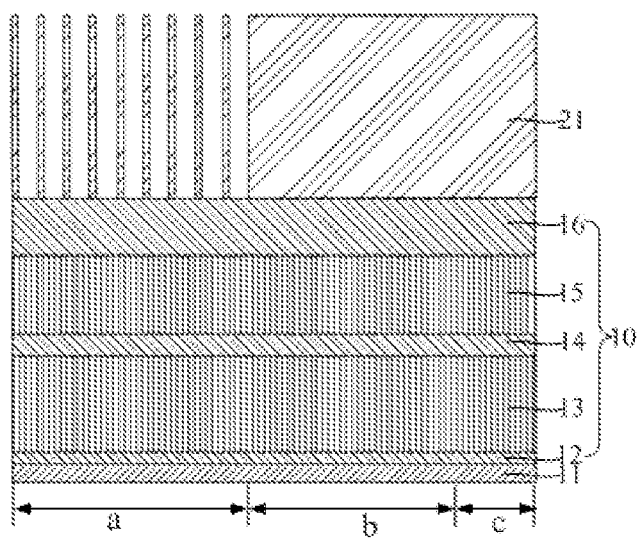
FIG. 29 is a cross-sectional view of a semiconductor structure in an embodiment of the present application, in which a silicon dioxide layer is completely etched away.
Figure 30:
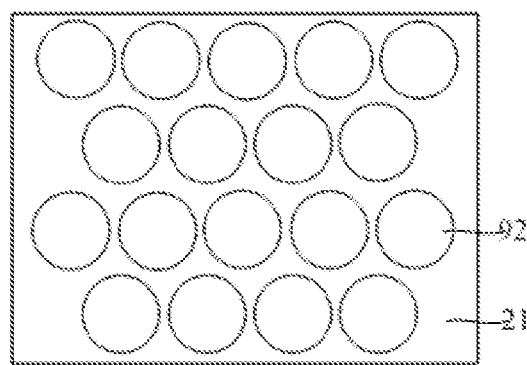
FIG. 30 is a top view of FIG. 29.
Figure 31:
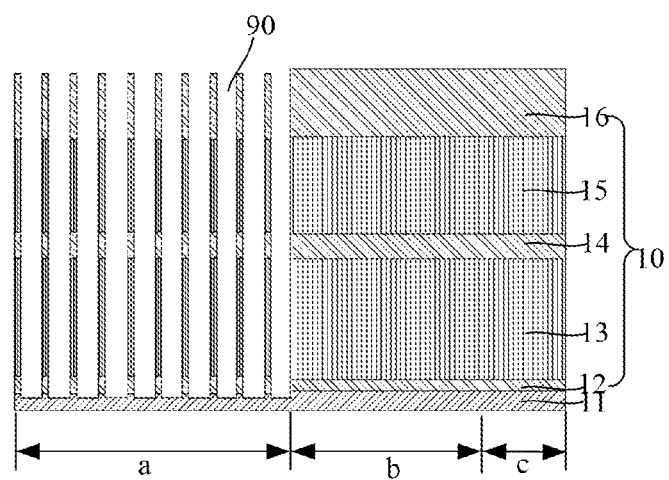
FIG. 31 is a cross-sectional view of a semiconductor structure in an embodiment of the present application, in which a capacitor hole is formed.
Figure 32:
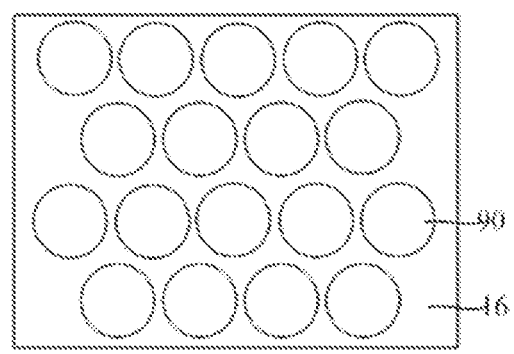
FIG. 32 is a top view of FIG. 31.

A specific operation may include the following operations. Referring to FIG. 24 to FIG. 32, the second polysilicon layer 23, the silicon dioxide layer 22 and the first polysilicon layer 21 on the stack 10 are sequentially etched, and the stack 10 is etched to form the capacitor hole 90 as shown in FIG. 32. It is to be noted that when the silicon dioxide layer 22 is etched, the silicon dioxide layer may be removed through wet etching with a high selectivity ratio, as shown in FIG. 28 to FIG. 30, so that load effect on the first polysilicon layer 21 is reduced, Critical Dimension Uniformity (CDU) in the stack 10 is improved, and therefore the dimension difference between the capacitor holes 90 in the stack 10 is reduced.

The embodiment further provides a semiconductor structure. The semiconductor structure is manufactured by the method for manufacturing a semiconductor structure provided in any above embodiment. During a manufacturing procedure, a first mask layer 30 is formed on a stack 10, in which a first etching hole 35 extending along a first direction is provided on the first mask layer 30. After the first mask layer 30 is formed, a side of the first mask layer 30 away from the stack 10 is planarized. A second mask layer 50 is formed on the first mask layer 30, in which a second etching hole 55 extending in a second direction is provided on the second mask layer 50, and the first etching hole 35 and the second etching hole 55 constitute an etching hole 92. A capacitor hole 90 is formed on the stack 10 through the etching hole 92, and a capacitor tube is formed in the capacitor hole 90. The first mask layer 30 is planarized before the second mask layer 50 is formed. Therefore, an impurity remaining on a surface of the first mask layer 30 may be removed, and material accumulation at a junction of the first mask layer 30 and the second mask layer 50 is avoided when the second mask layer 50 is formed. Therefore, the depths of the second etching hole 55 on the second mask layer 50 are the same, and the depths of the formed capacitor holes 90 are the same.

According to a method for manufacturing a semiconductor structure and a semiconductor structure provided by the embodiment of the present application, the first mask layer with the first etching hole is formed on the stack, and a side of the first mask layer away from the stack is planarized. That is, the side for arranging the second mask layer with the second etching hole is planarized, so that impurity residue on the first mask layer is avoided. Therefore, material accumulation on a residual impurity when the second mask layer is formed is avoided, and bulge formation at the bottom of the second etching hole is avoided. Compared with the related art, the bottom of the second etching hole formed by the method for manufacturing the semiconductor structure in the embodiment of the present application is flat, and the depths of capacitor holes are the same when the stack is etched along the first etching hole and the second etching hole to form the capacitor hole.

Finally, it is to be noted that, the above embodiments are merely used to describe the technical solutions of the present application and are not intended to limit the present application. Although the present application has been described in detail with reference to the foregoing embodiments, those skilled in the art will appreciate that: the technical solutions of the above embodiments may still be modified, or some or all of the technical features thereof may be equivalently replaced, and through these modifications and replacements, the nature of the corresponding technical solutions do not depart from the scope of the technical solutions of the embodiments of the present disclosure.

The invention claimed is:

1. A method for manufacturing a semiconductor structure, comprising:
   providing a substrate layer, and forming a stack on the substrate layer, the stack comprising a sacrificial layer and a supporting layer arranged one after the other;
   forming a first mask layer on the stack, a first etching pattern being formed in the first mask layer;
   planarizing a side of the first mask layer away from the stack;
   forming a second mask layer, a second etching pattern being formed in the second mask layer, the first etching pattern and the second etching pattern constituting an etching hole; and
   etching the stack along the etching hole to form a capacitor hole;
   wherein forming the first mask layer comprises:
      sequentially forming a first base layer and a first filling layer on the stack, and removing a part of the first filling layer to form a first intermediate hole extending along a first direction;
      forming a first separation layer on a side wall and a bottom of the first intermediate hole and on a surface of the first filling layer away from the first base layer; and
      forming a first filling material on the first separation layer, the first separation layer in the first intermediate hole forming the first etching pattern.

2. The method for manufacturing the semiconductor structure of claim 1, wherein the first filling material is higher than the first separation layer.

3. The method for manufacturing the semiconductor structure of claim 1, wherein the method, before forming the first separation layer, further comprises: forming a first etching buffer layer on the first filling layer.

4. The method for manufacturing the semiconductor structure of claim 1, wherein planarizing the side of the first mask layer away from the stack comprises:
   removing a first surface layer of the first filling layer, and the first separation layer and the first filling material located outside the first surface layer.

5. The method for manufacturing the semiconductor structure of claim 4, wherein removing the first surface layer of the first filling layer, and the first separation layer and the first filling material located outside the first surface layer comprises:
   removing the first surface layer, and the first separation layer and the first filling material located outside the first surface layer through a Chemical Mechanical Polishing (CMP) process.

6. The method for manufacturing the semiconductor structure of claim 1, wherein removing the part of the first filling layer to form the first intermediate hole extending along the first direction comprises:
   removing the part of the first filling layer and a part of the first base layer, so that the bottom of the first intermediate hole is located in the first base layer,
   a thickness of the first separation layer is equal to a depth of the first intermediate hole in the first base layer.

7. The method for manufacturing the semiconductor structure of claim 6, wherein removing the part of the first filling layer and the part of the first base layer, so that the bottom of the first intermediate hole is located in the first base layer comprises:
   coating a first photo resist layer on the first mask layer, a pattern being formed on the first photo resist layer, and etching the first filling layer by taking the first photo resist layer as a mask to form the first intermediate hole.

8. The method for manufacturing the semiconductor structure of claim 7, wherein the first filling layer is etched through a dry etching process.

9. The method for manufacturing the semiconductor structure of claim 1, wherein forming the second mask layer comprises:
   sequentially forming a second base layer and a second filling layer on the first mask layer;
   removing a part of the second base layer to form a second intermediate hole extending along a second direction; and
   forming a second separation layer on a side wall and a bottom of the second intermediate hole and on a surface of the second filling layer away from the second base layer, the second separation layer in the second intermediate hole forming the second etching pattern.

10. The method for manufacturing the semiconductor structure of claim 9, wherein an angle is formed between the first direction and the second direction.

11. The method for manufacturing the semiconductor structure of claim 9, wherein the method, before forming the second mask layer, further comprises:
   forming a second etching buffer layer on the second filling layer.

12. The method for manufacturing the semiconductor structure of claim 11, wherein forming the second intermediate hole comprises:
   forming a second photo resist layer on the second etching buffer layer, and etching the second filling layer by taking the second photo resist layer as a mask to form the second intermediate hole.

13. The method for manufacturing the semiconductor structure of claim 9, wherein the method, after forming the second separation layer, further comprises:
forming a preset mask plate on the second mask layer,
the second mask layer comprises an array region with the second etching pattern, a peripheral region in absence of the second etching pattern, and a junction region between the array region and the peripheral region, the preset mask plate covering the peripheral region and the junction region.

14. The method for manufacturing the semiconductor structure of claim 13, wherein the method, before forming the preset mask plate, comprises:
forming a second filling material on the second separation layer; and
removing a second surface layer of the second filling layer, and the second separation layer and the second filling material located outside the second surface layer.

15. The method for manufacturing the semiconductor structure of claim 14, wherein the method, after removing the second surface layer of the second filling layer, and the second separation layer and the second filling material located outside the second surface layer, further comprises:
removing the second filling layer and a remaining part of the second filling material.

16. The method for manufacturing the semiconductor structure of claim 9, wherein removing the part of the second base layer to form the second intermediate hole extending along the second direction comprises:
removing a part of the second filling layer and the part of the second base layer, so that the bottom of the second intermediate hole is located in the second base layer,
a thickness of the second separation layer is equal to a depth of the second intermediate hole in the second base layer.

17. The method for manufacturing the semiconductor structure of claim 1, wherein the method, before forming the first mask layer, comprises:
sequentially forming a first polysilicon layer, a silicon dioxide layer, and a second polysilicon layer on the stack.

18. The method for manufacturing the semiconductor structure of claim 17, wherein the silicon dioxide layer is a layer of boron phosphorus silicon glass, and a doping concentration of boron and phosphorus in the layer of boron phosphorus silicon glass is gradually changed along a direction away from the first polysilicon layer.

19. A method for manufacturing a semiconductor structure, comprising:
providing a substrate layer, and forming a stack on the substrate layer, the stack comprising a sacrificial layer and a supporting layer arranged one after the other;
sequentially forming a first polysilicon layer, a silicon dioxide layer, and a second polysilicon layer on the stack;
forming a first mask layer on the second polysilicon layer formed on the stack, a first etching pattern being formed in the first mask layer;
planarizing a side of the first mask layer away from the stack;
forming a second mask layer, a second etching pattern being formed in the second mask layer, the first etching pattern and the second etching pattern constituting an etching hole; and
sequentially etching the second polysilicon layer, the silicon dioxide layer and the first polysilicon layer and the stack along the etching hole to form a capacitor hole;
wherein the silicon dioxide layer is a layer of boron phosphorus silicon glass, and a doping concentration of boron and phosphorus in the layer of boron phosphorus silicon glass is gradually changed along a direction away from the first polysilicon layer.

20. A semiconductor structure, formed through a method for manufacturing the semiconductor structure, the method comprising:
providing a substrate layer, and forming a stack on the substrate layer, the stack comprising a sacrificial layer and a supporting layer arranged one after the other;
forming a first mask layer on the stack, a first etching pattern being formed in the first mask layer;
planarizing a side of the first mask layer away from the stack;
forming a second mask layer, a second etching pattern being formed in the second mask layer, the first etching pattern and the second etching pattern constituting an etching hole; and
etching the stack along the etching hole to form a capacitor hole;
wherein forming the first mask layer comprises:
sequentially forming a first base layer and a first filling layer on the stack, and removing a part of the first filling layer to form a first intermediate hole extending along a first direction;
forming a first separation layer on a side wall and a bottom of the first intermediate hole and on a surface of the first filling layer away from the first base layer; and
forming a first filling material on the first separation layer, the first separation layer in the first intermediate hole forming the first etching pattern.

* * * * *